US005255152A

United States Patent [19]

Estes, III et al.

[11] Patent Number: 5,255,152

[45] Date of Patent: Oct. 19, 1993

[54] CONTROLLER FOR FIXED-TIME PULL-IN OF A RELAY

[75] Inventors: Bay E. Estes, III; Richard H. Noens, both of Palatine, Ill.

[73] Assignee: Eaton Corporation, Cleveland, Ohio

[21] Appl. No.: 747,831

[22] Filed: Aug. 21, 1991

[51] Int. Cl.[5] .................... H01H 47/02; H03K 3/017

[52] U.S. Cl. .................................. 361/160; 361/203; 307/265; 371/25.1

[58] Field of Search ............... 324/418, 423; 340/644; 361/6, 152–154, 160, 170, 185, 195–198, 205, 186, 187, 203; 331/143, 111, 177 R; 328/34, 58; 307/112, 116, 253, 265, 271; 341/152; 371/25.1

[56] References Cited

U.S. PATENT DOCUMENTS

| | | | |
|---|---|---|---|
| 3,612,901 | 10/1971 | Loe | 307/106 |
| 3,629,710 | 12/1971 | Durland | 328/58 |
| 3,922,587 | 11/1975 | Jones | 361/159 |
| 4,381,532 | 4/1983 | Arnold | 361/154 |
| 4,604,983 | 8/1986 | Carp et al. | 361/154 X |
| 4,729,056 | 3/1988 | Edwards et al. | 361/153 |
| 4,745,514 | 5/1988 | Takeshima et al. | 361/154 |
| 4,848,943 | 7/1989 | Sutcliffe | 361/152 X |
| 4,864,285 | 9/1989 | Rodden | 340/644 |
| 4,878,147 | 10/1989 | Oyama et al. | 361/154 |
| 4,978,865 | 12/1990 | Hartmann et al. | 307/140 |
| 5,008,516 | 4/1991 | Holling | 361/160 X |
| 5,055,962 | 10/1991 | Peterson et al. | 361/187 |

*Primary Examiner*—A. D. Pellinen
*Assistant Examiner*—Fr.tz M. Fleming
*Attorney, Agent, or Firm*—C. H. Grace

[57] ABSTRACT

A controller for a relay controls the pull-in time of the armature of the relay by controlling the power applied to the relay coil. To determine the actual pull-in time, the time of closure of the contacts is sensed and the time at which power is applied to the coil is subtracted from it. The actual pull-in time is then compared with a stored value of ideal pull-in time to produce an error signal. The error signal corrects the level of power applied to the relay coil upon the next actuation of the relay, to make the actual pull-in time approximately equal to the ideal pull-in time. In some embodiments to control the level of power on the coil, a Gray-code counter samples a duty-cycle register in a micro-computer and produces a train of pulses that is filtered to provide a DC control signal. The DC control signal controls the duty cycle of a pulse-width-modulated oscillator that rapidly switches (modulates) the power to the relay coil.

12 Claims, 4 Drawing Sheets

AC LINE
+24V
R
+5V
SLOW PULSE GENERATOR
SETTABLE DUTY-CYCLE REGISTER
PULL-IN TIMER
COMPARE PHASE
PULSE OSC 1 KHZ
COMPARE
PRESETTABLE PHASE REGISTER
CLOCK
IDEAL PULL-IN TIME REGISTER
MICROCOMPUTER
AC LINE SENSING
+/−

CONTROLLER FOR FIXED-TIME PULL-IN OF A RELAY

FIELD OF THE INVENTION

The invention relates to control circuitry for energizing electromechanical relays in such a way as to achieve long contact life.

BACKGROUND

An electromechanical relay having a coil and relay contacts is often used to control the power level to a load by turning the power on and off repeatedly. Typically the modulation period is in the range of ten seconds to ten minutes. Many operations of the relay are required over the life of a product such as a microwave oven, in which a magnetron is often controlled by such a relay. Electric ranges also operate in this way.

The operational life of a power-switching relay is limited by contact erosion. One factor that affects the erosion of relay contacts is the phase angle on the AC line at which the contacts close. The ideal phase angle depends upon the type of load being switched. By applying power to the relay coil at the best phase on the AC cycle the life of the relay can be extended.

In the prior art a relay has been energized by an electronic controller in such a way as to control the time at which the relay contacts close with respect to AC variations of voltage in the load circuit. The time of closure of the relay contacts tends to vary from a desirable phase angle on the AC wave because of slow variations in the pull-in time that occur with heating of the relay coil, etc. In the prior art, a constant phase angle of closure time was obtained by sensing the time of closure and applying voltage to the relay coil at an earlier or later time to compensate for variations in the pull-in time.

Another factor affecting erosion is contact bouncing upon closure. A properly designed relay has a minimum bounce time when its nominal rate voltage is applied to its coil and the ambient temperature of the environment of the coil is about room temperature. Each relay has an ideal pull-in time for producing minimum bounce. When the coil is at higher temperatures, the resistance of the coil is higher and additional voltage is required to achieve the ideal pull-in time. Some previous control systems have adjusted the instant of application of power to the coil to compensate for variations in relay pull-in time, in order to achieve a desired phase angle of contact closure.

SUMMARY OF THE INVENTION

In the present invention, not only do the relay contacts close at a predetermined best phase angle on the AC cycle of the load, but advantage is also taken of the fact that the rate of erosion of relay contacts is very dependent upon the pull-in or transit time, and the pull-in time is controlled.

Most of the erosion occurs upon making (closing) of the contacts, not upon breaking (opening), despite the fact that a more conspicuous arc is drawn upon breaking than upon making. During breaking of the contacts, the contacts are moving apart so rapidly that the arc is quickly extinguished.

Upon making, however, the contacts touch each other, bounce apart, touch each other again, bounce apart again, etc. While they are almost but not quite touching an arc is drawn between the contacts, which is very damaging to the contact surfaces. The contacts are in close enough proximity to maintain a vigorous arc for a relatively long time.

Tests have shown that for a given relay, erosion can be minimized by having the contacts approach each other with a particular predetermined closure time or transit time, i.e. the time between start of voltage on the relay coil and actual closure of the contacts. In the present invention, this "ideal" pull-in or transit time (as well as the phase angle of closure on the AC cycle), is held constant.

Constant ideal pull-in time is accomplished by first measuring the actual pull-in time with a timer. The timer is started when voltage is applied to the relay coil, and stopped by receipt of a signal indicating that the contacts have actually closed. Then the voltage applied to the relay coil is automatically adjusted so that the actual pull-in time equals the ideal pull-in time, as stored in an ideal-pull-in-time register.

Accordingly, one object of the invention is to provide a method and a controller for controlling the actual pull-in time, i.e. the time between a) the application of power to the relay coil and b) closure of the relay's contacts, irrespective of such independent variables as coil temperature.

Another object is to provide a method and a controller for controlling a relay in which the average level of power applied to the coil of the relay is automatically adjusted to cause the pull-in time to equal a predetermined value.

Another object is to provide a method and a controller for a relay in which an ideal pull-in time is predetermined and stored and the actual pull-in time is measured and compared with the ideal pull-in time and the level of power applied to the relay coil is adjusted so that on the next actuation of the relay the actual pull-in time is approximately equal to the ideal pull-in time.

Another object is to provide a method and a controller for controlling the relay as above and in which the level of power applied to the coil to actuate the relay is adjusted by adjusting the duty cycle of rapidly pulsed power applied to the coil by means of a pulse-width-modulated switch.

Another object is to provide a method and a controller for controlling the relay, in which a computer computes an appropriate pulse width for pulse-width-modulation of power applied to the coil of the relay.

Another object is to provide a method and a controller for controlling the relay as stated immediately above, and in which an oscillator and switch provide pulse-width-modulated switching of power to the relay coil, and the duty cycle of the oscillator is controlled by a DC control signal derived from a computer.

Another object is to provide a method and a controller as above and in which the DC control signal for controlling the oscillator utilizes a duty-cycle register, and has a Gray-code counter for periodically sampling the contents of individual stages of the duty-cycle register so as to provide a train of relatively higher frequency, shorter, unipolar pulses, which are filtered to a DC level and utilized to control the duty cycle of the oscillator.

Other objects are apparent from the drawings as well as the description and claims that follow.

BRIEF DESCRIPTION OF THE DRAWINGS

In FIG. 3 a Gray-code counter is utilized to increase the frequency of output pulses that enter the low-pass filter 53, 55 of FIG. 2.

DESCRIPTION OF PREFERRED EMBODIMENTS

In this invention, electronic circuitry that opens and closes the relay also monitors its pull-in time. That circuitry then adjusts the coil voltage for the next closure of the relay to obtain an ideal pull-in time. This maximizes the relay life.

There are two popular basic ways of changing load voltages when an unregulated bulk supply is available, namely a linear technique and a switching-mode technique. A switching-mode technique is much more efficient. By modulating an electronic switch with a controlled duty cycle at a high-enough frequency any average voltage can be applied to the relay coil.

There are many types of control systems for a switching-mode control. If the application already utilizes a microcomputer for other control functions, it can be used also to measure the relay's closure time and control the modulation duty cycle and, if desired, the frequency.

One requirement here is to control the voltage (and thus the current) applied to a relay coil such that the pull-in time (from application of the coil voltage to contact closure) is a relatively constant or fixed value under any slowly varying conditions of independent variables. Moreover, the control circuit initiates the pull-in at a time that is relatively fixed with respect to the phase of the power line cycle. Thus the relay contacts always close at nearly the same phase in the line cycle (in the case of a microwave oven, near the peak of a cycle). The pull-in time is measured by the control circuit (in the present embodiments, a microcomputer integrated circuit and an optocoupler), which adjusts the voltage appropriately for the next relay pull-in if there is an error in the pull-in time.

The coil supply voltage is smooth 24 volt DC, which is adjusted by a pulse-width-modulated (PWM) signal produced by the controller at a nominal center 50% duty cycle. The relay coil is rated at 12 volts. The modulation frequency is high enough that the inductance of the relay coil, and the parallel diode reduce the coil's ripple current to a low enough value to avoid relay chatter and excessive heating.

FIRST EMBODIMENT

Figure 1:
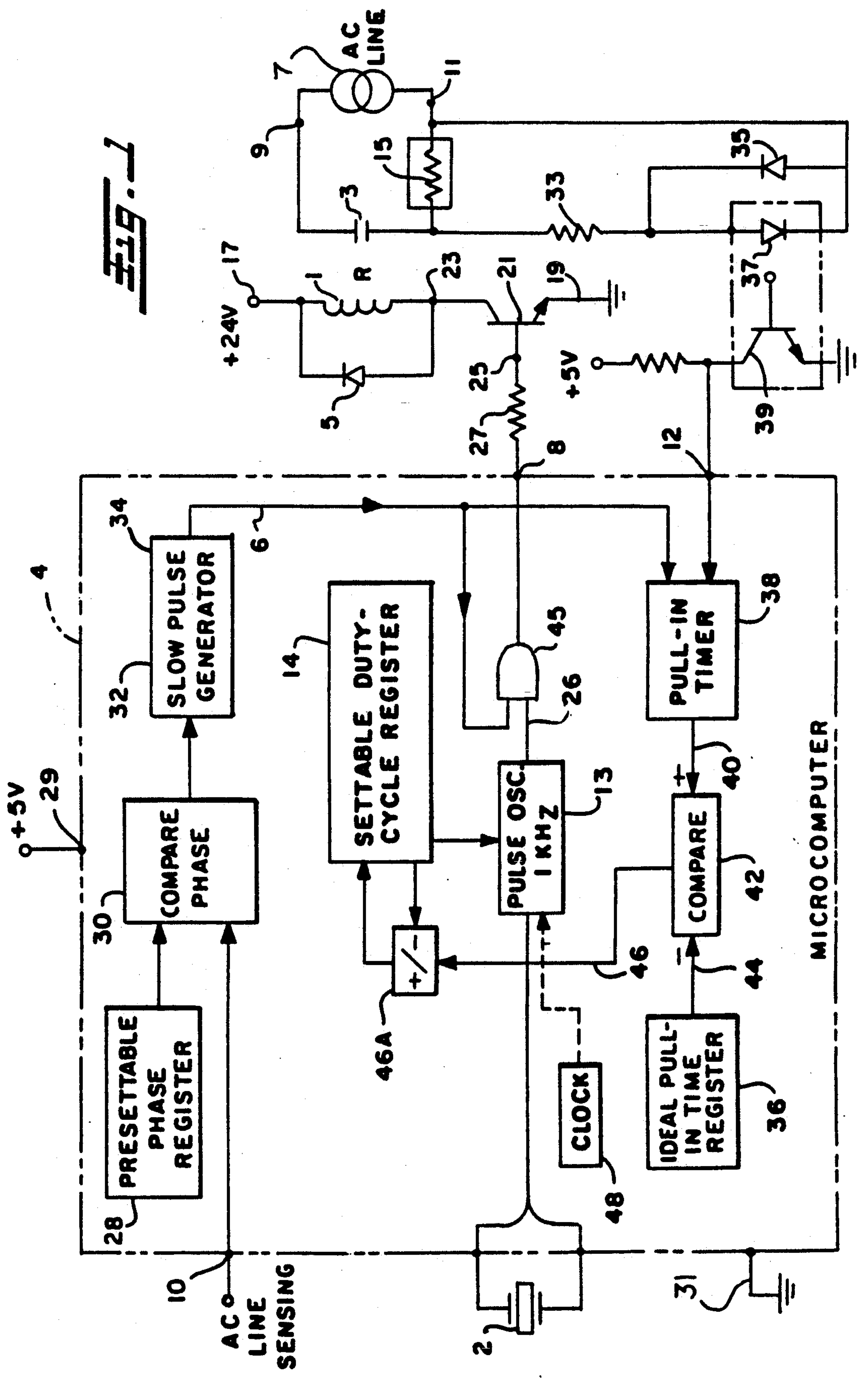
FIG. 1 shows a first embodiment of the invention, in which a microcomputer intermittently outputs a train of pulse-width-modulated signals to modulate a single switching transistor in series with a relay coil.
Figure 2:
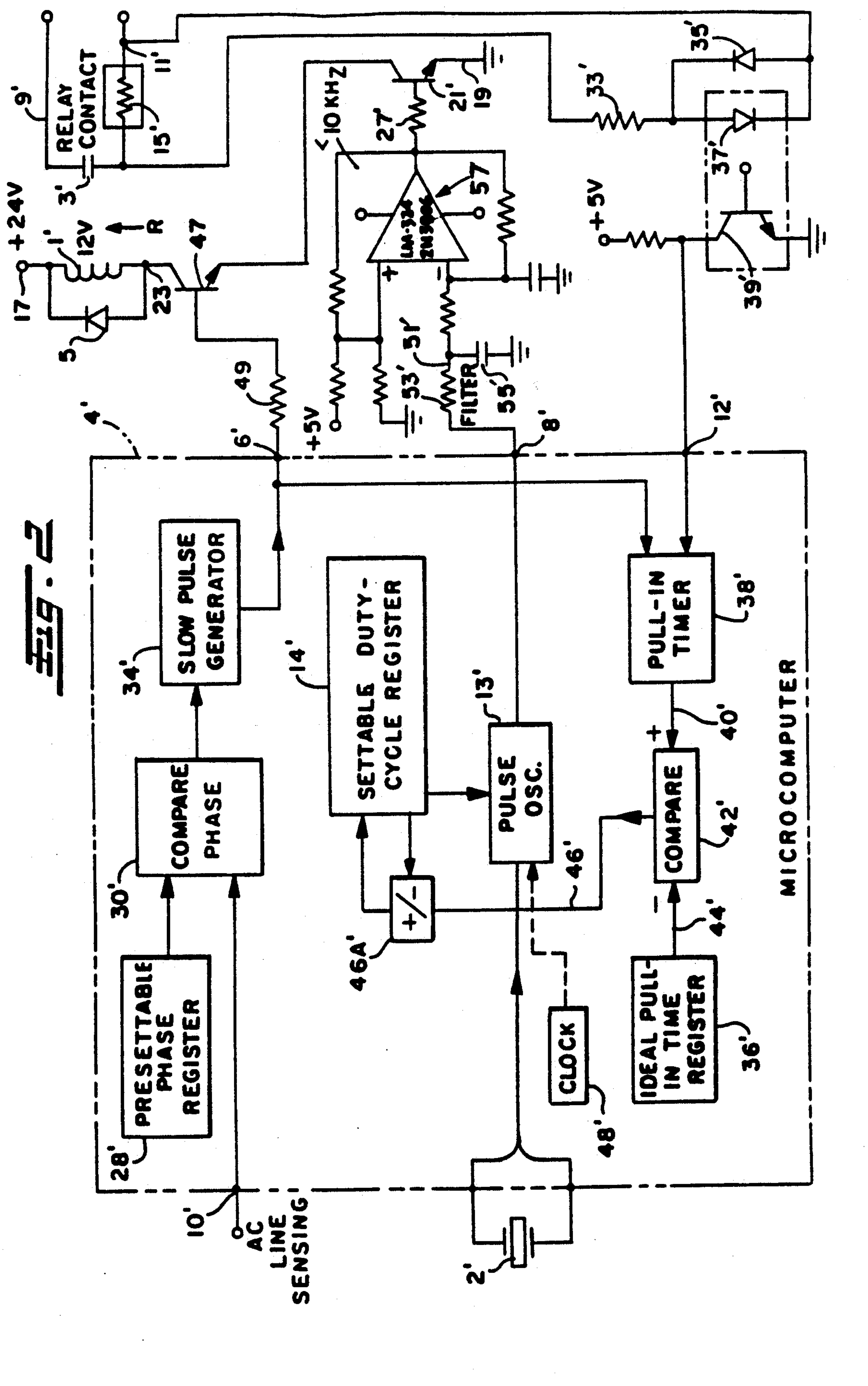
FIG. 2 shows a second embodiment in which a microcomputer outputs the same type of signal as in FIG. 1, but in which the signal is low-pass filtered and applied to a duty-cycle-control terminal of a Schmitt-trigger oscillator, which pulse-width modulates a switching transistor 21. Another switching transistor 47 turns the coil power on and off to actuate and release the relay contacts.
Figure 3:
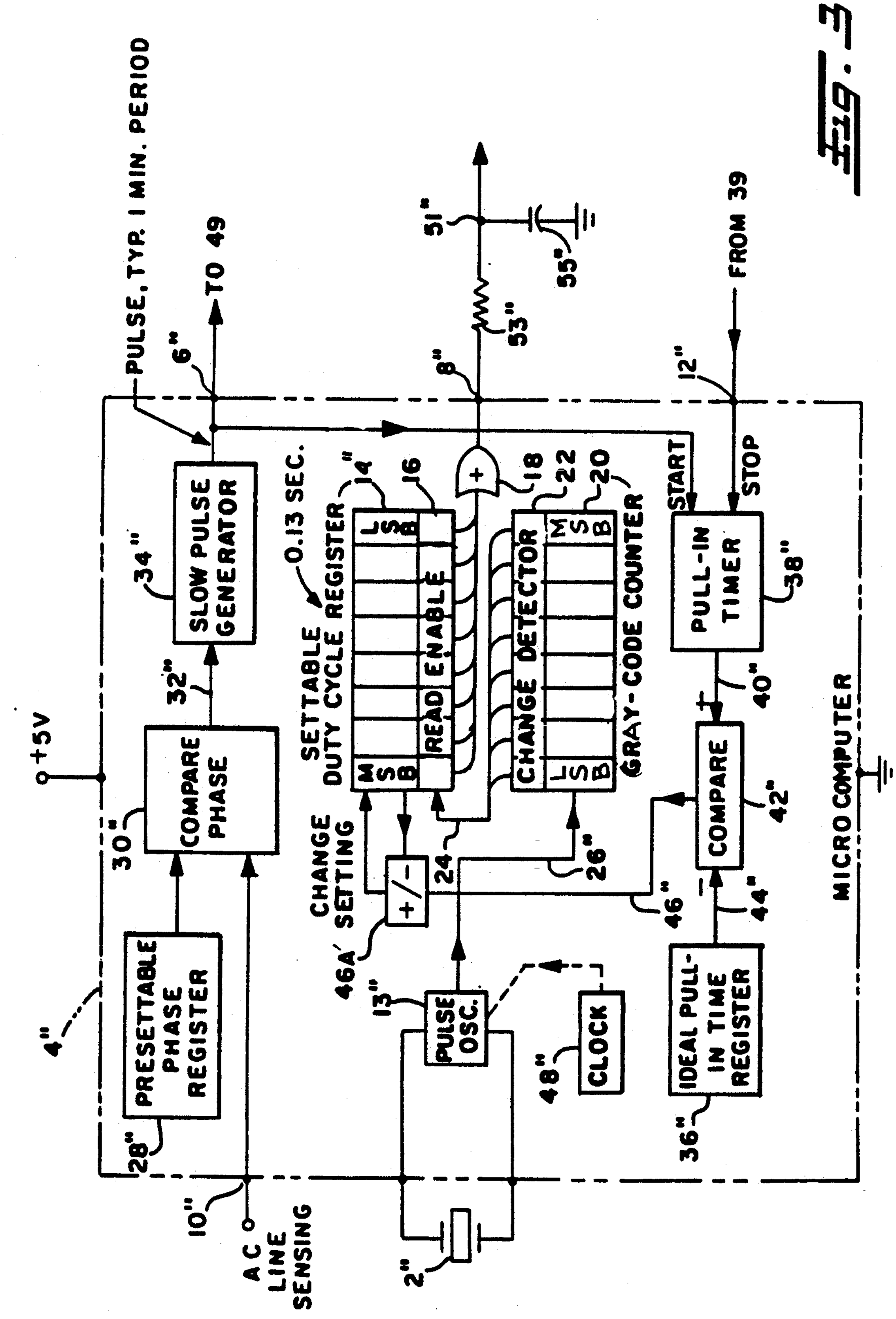
FIG. 3 shows a portion of a third embodiment, to which all of FIG. 2 also applies except to the software of the microcomputer.

FIGS. 1, 2 and 3 include representations of functions of the microcomputer 4, 4′, 4″. Hardware-type blocks are used to facilitate clear disclosure of the functions of the microcomputer, although most of the functions are actually performed by software in the preferred embodiments. A software program for performing the functions is easy to prepare in any of many possible ways, so the details of the program are omitted and the programs are described instead by stylized functional blocks in the figures.

One possible implementation of this type of design is shown in the circuit of FIG. 1, which represents a microwave oven controller. It utilizes the broad concept that is being claimed in this invention, namely, controlling the pull-in time of the armature of the relay, by controlling of the power applied to the coil. The power can be controlled by continuous means or pulse-width-modulated (PWM) binary means. In the case of the PWM binary means, a switching transistor is used in series with the coil of the relay, and the efficiency is greater than would be the case if a series-connected dissipative analog continuous-control device were used.

FIG. 1 shows the details. A relay R to be controlled has a coil 1 and load contacts 3. AC line voltage from a source 7 is connected to terminals 9 and 11 to provide power to a series circuit consisting of the contacts 3 and a load, which is a magnetron 15.

DC voltage from a positive 24-volt source is applied to one terminal 17 of the relay coil 1, and the negative of the DC supply is connected to a ground terminal 19. A diode 5 across the relay coil 1 maintains the coil's current when the transistor 21 is in the off portion of its modulation cycle. An NPN transistor switch 21 has its collector connected to the other terminal 23 of the relay coil 1 and its emitter connected to the ground terminal 19. A base terminal 25 of the transistor 21 receives on and off control signals through a resistor 27 from the microcomputer 4.

The relay coil current equals 24 volts times the percentage duty cycle of the switch 21 divided by the coil resistance. A 1 KHz modulation frequency generated by the microcomputer 4 is employed in the first embodiment. Care must be taken to have enough resolution for fine adjustment of the duty cycle and thus of the pull-in time.

A positive 5-volt power supply is connected to a terminal 29 and a ground connection is made at a terminal 31 of the microcomputer 4. The AC source 7, which has the same AC phase as the potential at terminal 9, is connected also to an AC line sensing terminal 10 of the microcomputer, through a transformer or other coupler if necessary. A crystal ceramic resonator 2 is also connected to the microcomputer 4.

A contact closure sensing circuit is also shown in FIG. 1. It senses the voltage drop across the load 15 by means of a resistor 33, a diode 35, and a back-to-back-connected photodiode 37. A phototransistor 39 is arranged to receive light signals from the photodiode 37 and thereupon to provide a corresponding electronic signal at a microcomputer terminal 12. Terminal 12 is at a junction of a collector and a collector load resistor of the phototransistor 39, whose emitter is grounded.

The optocoupler 39 is used if it is necessary to isolate relay contacts and the power line from the control circuitry.

Figure 4:
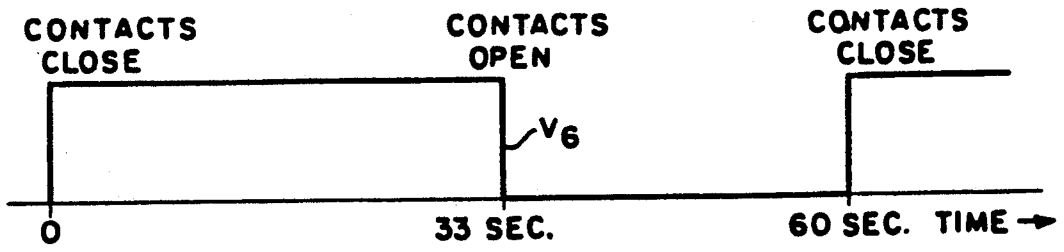
FIG. 4 shows a typical time scale in which a relay is closed and opened in a microwave oven application.

The operation of the circuit in FIG. 1 is as follows: In the particular application being described as an example, the microcomputer 4 energizes the relay coil 1 at intervals starting one minute apart and keeps the relay closed for about one-half minute upon each actuation of the relay. See FIG. 4. During each of the one-half-minute intervals in which the relay coil 1 is energized, the microcomputer 4 outputs a train of pulse-width-modulated signals at a terminal 8 to switch the transistor 21 on and off at a frequency of about 1 KHz.

Figure 5:
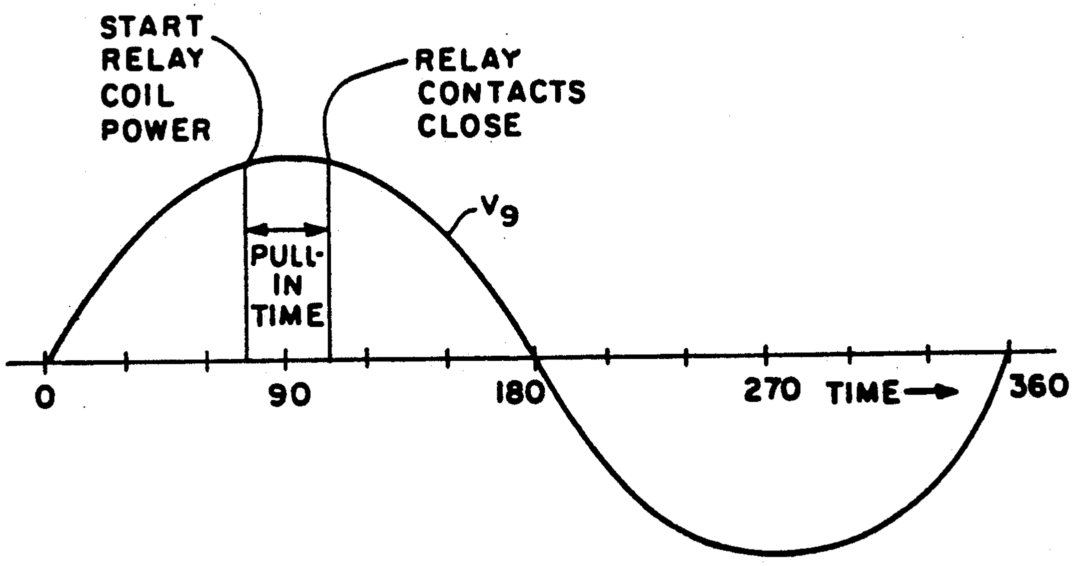
FIG. 5 shows an AC source voltage supplying a load-and-relay-contact circuit, and the time of starting a train of pulse-width-modulated switching signals to the coil, and the time of load-contact closure.

A short time after a train of PWM signals starts, the relay contacts 3 close; this is the end of the actual pull-in time of the relay. See FIG. 5, waveform V9. AC current passes through the load 15 and produces a current through the photodiode 37. A resulting light signal is detected by the phototransistor 39, which causes an electrical feedback signal at microcomputer terminal 12 to indicate closure of the relay contacts 3.

Within the microcomputer 4, a pull-in timer 38, which was started at the start of the pulse train at terminal 8, is stopped by the contact closure signal at terminal 12. Thus the timer 38 measures the actual pull-in time of the relay R. Its output at 40 is compared with an ideal pull-in time, which is stored in a register 36. The comparison is made in a comparator 42 which receives the ideal-pull-in-time data along lines 44.

The comparator 42 outputs an error signal on lines 46, which are connected to an adder/subtractor 46A, which connects to a settable duty-cycle register 14 to change the setting of that duty-cycle register upward or downward, depending upon the sign and magnitude of the error signal at lines 46. The duty-cycle register 14 controls the duty cycle of the output binary signal of 1 KHz that passes through an AND gate 45 to the terminal 8.

The train of control signals at terminal 8 is gated on for about one-half minute and off for about one-half minute in the present example by the gate 45.

If the closure time of the relay R, as measured by the pull-in timer 38, is greater than the ideal pull-in time stored in register 36, the contents of the duty-cycle register 14 are increased, affecting oscillator 13 so that the duty cycle at terminal 8 is increased. As a result, the transistor 21 is in a conductive condition a greater percentage of the time and the actual pull-in time becomes smaller. Error correction continues through the closed loop just described, in successive actuations of the relay, until the actual pull-in time is approximately equal to the ideal pull-time stored in register 36.

A program for performing the functions just described is within ordinary skill of the art of microcomputer programming and hence need not be described here in any further detail to enable the practice of the invention.

One problem with this first embodiment is that the modulation frequency on the coil is generated directly by the microcomputer. The best frequency for coil energization may be so high (its period so short), that the microcomputer 4 may not be fast enough to make small enough step changes in the pulse widths to achieve the resolution required to make fine-enough adjustments in the duty cycle.

SECOND EMBODIMENT

In a second embodiment, FIG. 2, an 8-bit resolution capability was achieved for a microwave oven controller. The microcomputer 4' takes 0.13 seconds (a 7.7 Hz frequency) to put out a PWM signal with 8 bits of resolution. This PWM signal is fed into a lowpass filter 53, 55 having a time constant of about 4 seconds to obtain a rather smooth DC voltage at a terminal 51.

This DC voltage is used to adjust the duty cycle of a high-frequency (in this example about 10 KHz) oscillator 57. The oscillator 57 has a nominal duty cycle of 50% when the microcomputer's PWM signal (at terminal 8') is at 50% duty cycle. In this particular embodiment the duty cycle of oscillator 57 varies about its nominal value at 0.6 times the rate of variation of the duty cycle of the PWM at 8' from the microcomputer.

FIG. 2 shows more details. The oscillator 9 controls a transistor 21' which turns the 24 volt DC power on and off to the 12 volt relay coil 1' at the 10 KHz frequency.

A second transistor 47 is turned on and off by the microcomputer 4' at proper times in the power line cycle. The pull-in time is measured by the microcomputer 4', which then makes whatever adjustment to its PWM duty cycle is necessary to correct any deviation from the ideal pull-in time. In this second embodiment, a duty-cycle register 14' in the microcomputer 4' adjusts, once upon each computation of a new value for duty cycle, the duty cycle of a pulse train that appears at terminal 8'.

In this second embodiment, the NPN switching transistor 47 receives a control signal through a resistor 49 from a terminal 6' of the microcontroller 4'. The terminal 6' is controlled by a circuit like that of components 28, 30, 34 of FIG. 1 and components 28'', 30'', 34'' of FIG. 3, to be described subsequently. The transistor 47 is turned on for about one-half minute and off for about one-half minute repeatedly in the present example, by the signal at the terminal 6' that is produced by the microcontroller 4'. See FIG. 4 for an illustration of the waveform, V6.

The relay-contact circuit 3', 15' and the closure-sensing feedback circuit 39', etc. are the same as in FIG. 1.

The switching transistor 21' is turned on and off with a pulse-width-modulated control signal at its base resistor 27' at about a 10 KHz rate. The 10 KHz signal is provided by the oscillator 57, which is of conventional design, of a type referred to as a Schmitt-trigger oscillator. The duty cycle of the Schmitt-trigger oscillator 57 is controlled by the level of DC signal applied at its control terminal 51'.

When the DC voltage at the DC control terminal 51' is altered, a different time is required for the Schmitt-trigger signal to reach a threshold level at which it changes state, so that duty cycle of the output of the Schmitt-trigger oscillator 57 is changed. The DC signal at terminal 51' is at the output of a lowpass filter consisting of the series resistor 53' from the terminal 8' and the shunt capacitor 55'. Thus a unipolar train of signals is provided by the microcomputer 4' at its output terminal 8', to control the duty cycle of the Schmitt-trigger oscillator 57.

The operation of the circuit of FIG. 2 is similar to that of the first embodiment, FIG. 1, except that the gating at one minute intervals is accomplished by transistor 47 of FIG. 2 instead of by the microcomputer 4, and, more importantly, the additional Schmitt-trigger oscillator 57 is provided, operating at the relatively high frequency of 10 KHz, under the control of the DC control signal at its terminal 51'. The signals at terminal 8' are provided by a pulse oscillator 13' like the oscillator 13, under the control of a duty-cycle register 14' like register 14, as described in connection with the first embodiment.

If the actual pull-in time of the relay R is greater than the ideal pull-in time stored in register 36', an error signal is developed in the microcomputer 4', which changes the setting of duty-cycle register 14'. The duty-cycle register 14' controls the duty cycle of the binary output signal of pulse oscillator 13' at terminal 8', and corrects the actual pull-in time.

The circuit of FIG. 2 overcomes the fine-adjustment problem present in the circuit of FIG. 1. The microcomputer 4' still puts out a pulse train having a duty cycle but at a much lower frequency. The filter 53', 55' then removes most of the AC components to obtain a DC signal, and this signal feeds the input terminal 51' for adjustment of the duty cycle of the Schmitt-trigger oscillator 57. Since the oscillator 57 is always on, the relay coil 1 must be turned on and off by the other series transistor, 47.

A disadvantage of this second embodiment is that the frequency from the microcomputer 4' might be so low that a very long filter time constant 53', 55' of perhaps several seconds, might be required to remove the AC components from the duty cycle signal at terminal 51'. This would result in a very slowly responding system.

THIRD EMBODIMENT

In the third embodiment the time constant and therefore the size of the filter 53', 55' have been greatly reduced. The duty cycle data in a duty-cycle register 14'' (FIG. 3) is divided into many small "pieces" before it is applied to a terminal 8'', thereby raising the minimum frequency component going into the filter. In order to have enough pieces, one must limit the minimum and maximum duty cycle that the microcomputer outputs. To reduce the filter size by eight times, the duty cycle is between $\frac{1}{8}$ and $\frac{7}{8}$. The loss of one-fourth of the control range can be made up by increasing the resolution of the duty cycle if necessary.

A Gray-code counter can be utilized to divide the signal. A Gray-code counter changes only one of its bits upon each count. The Gray code is described in the book "Reference Data for Radio Engineers," Sixth Edition, ITT Corporation, pages 40-4 and 40-5, wherein Table 4 shows the counting sequence of a Gray code. The least significant bit (LSB) of the Gray-code counter changes once every other count; the next, LSB changes on every fourth clock count; etc. The Gray-code counter 20 can be generated using instructions stored in the read-only memory (ROM) of the microcomputer 4''. The duty cycle is a binary number stored in the random-access memory (RAM) of the microcomputer.

The sampling algorithm employed is, at each clock count, to ascertain which bit has changed in the Gray-code counter. If the LSB has changed, read the MSB of the duty cycle register. If this bit is 0, output a 0; if this bit is 1, output a 1. If the next LSB has changed, look at the next-MSB of the duty cycle. If this bit is 0, output a 0; if this bit is 1, output a 1, etc.

Figure 6:
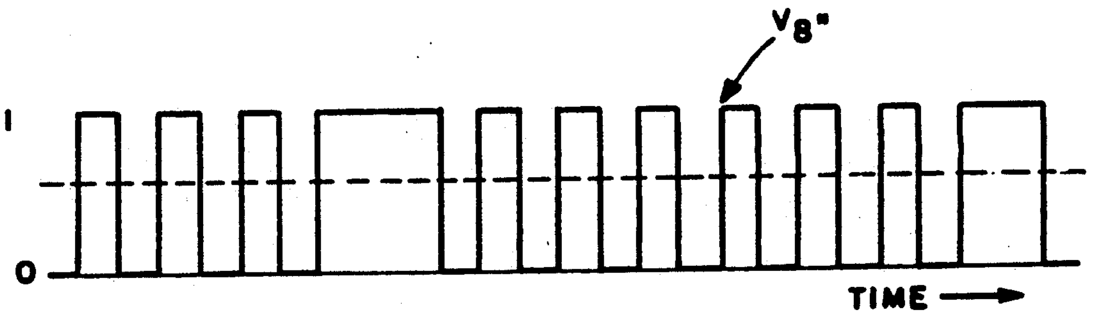
FIG. 6 shows an output signal of the microcomputer as it enters the low-pass filter 53″, 55″ in the third embodiment; a duty-cycle register in the computer is rapidly accessed by a Gray-code counter.

After the program has looked at a complete cycle of the Gray-code counter and outputted the proper 0's and 1's, a pulse train has been created which has the same duty cycle, produced by appropriate percentages of 0's and 1's, as was specified in the duty-cycle register 14'', but they are distributed very finely throughout the period of a complete cycle of the counter 20. See FIG. 6 for a waveform (V8'') representing a typical duty cycle at terminal 8''.

Embodiment 3 is represented by both FIG. 2 and FIG. 3. Most of the description of the operation of the second embodiment, FIG. 2, applies also to the third embodiment and hence need not be repeated here. Although FIG. 2 applies to both the second and third embodiments, the values of the filter components 53'', 55'' are much smaller than values of the filter components 53', 55', which is a major advantage of the third embodiment over the second embodiment.

The microcomputer 4'' is supplied by a five-volt power supply as shown at the top of FIG. 3, and is connected to a ground potential as shown at the bottom of the figure. An AC sensing line at a terminal 10'' has a fixed phase relationship with respect to the phase of AC voltage applied to the relay contact and load circuit 9', 11' of FIG. 2. The signal at terminal 10'' is compared with the contents of the presettable phase register 28'' in a phase comparator or time comparator 30''.

When the signal on the AC sensing line 10'' reaches a predetermined phase angle, the comparator 30'' outputs a pulse on line 32'' to start an output pulse from a slow-pulse generator 34'' to close and hold the relay R. The output pulse of generator 34'', which is at a terminal 6', 6'' of FIGS. 2 and 3 respectively, typically has a duration between 5 seconds and 10 minutes. It performs a switching function by means of the transistor 47.

The resonator 2'' shown on FIG. 3 determines the frequency of a pulse oscillator 13'' within the microcontroller 4''. The frequency of pulse generation is about 2K Hertz. Pulses from the pulse generator 13'' are input along a line 26'' to be counted by an eight-stage Gray-code counter 20. Each stage of the Gray-code counter 20 is provided with a change detector 22, which detects when the contents of a stage change from a 1 to a 0 or vice versa.

Only one stage of the Gray-code counter 20 changes its contents upon each cycle of the pulse signal on line 26''. The stage of the Gray-code counter that changes is identified on lines 24, and one of those lines enables the reading (through a read-enable gate 16) of the contents of a particular stage of a duty-cycle register 14''.

When the LSB of the Gray-code counter 20 changes, the MSB of the duty-cycle register 14'' is read, (i.e. copied), and the reading passes through a (symbolic) OR gate 18 to the output terminal 8'' of the microcomputer 4''. When the MSB of the Gray-code counter 20 is the stage that has experienced a change, the LSB of the read-enable device 16 enables the reading of the LSB of the duty-cycle register 14''. The contents of that LSB stage are then read into the OR gate 18 and applied to the output terminal 8''. The contents of other stages of the duty-cycle register 14'' are similarly copied into an input of the OR gate 18 when called upon by the read-enable circuit 16.

The Gray-code counter 20 preferably scans the duty-cycle register 14'' an integral number of times within the period of change (up-dating) of the duty-cycle register 14''. Because the LSB of the Gray-code counter changes state every other cycle of the pulse oscillator 13'', the MSB of the duty-cycle register is copied and its reading is placed at the terminal 8'' upon every other cycle. In that way the MSB is most heavily weighted because of the great frequency with which it is sampled. Similarly, each of the other stages of the duty-cycle register 14″ is sampled with a relative frequency depending upon its appropriate weight.

In the manner just described a succession of pulses is produced at the terminal 8″, whose frequency can be at least eight times the frequency of change (7.7 Hertz) of the duty-cycle register 14″. This relatively higher-frequency signal has the average duty cycle (averaged over a complete cycle of the Grey-code counter 20, which is at least 8 counts of oscillator 13″) specified in register 14″. Consequently its DC value after filtering is the same as the DC value of the output at terminal 8′ of the second embodiment, FIG. 2. The filter components 51″, 53″ can therefore be much smaller in the third embodiment, for a given acceptable ripple level at the input terminal 51″ of the Schmitt-trigger oscillator.

The operation of the pull-in timer 38″, the comparator 42″, the register 36″, and the adder/subtractor 46A″ are the same as in the first embodiment and will not be repeated here.

A change in the duty cycle at terminal 8″ changes the switching duty cycle, at the much higher frequency of 10 KHz, of oscillator 57 and transistor 21, and therefore changes the average voltage applied to the relay coil 1. The change is in such a direction, (increase or decrease), as to reduce the difference signal from the comparator 42″, so the actual pull-in time approaches the ideal pull-in time.

It may be helpful to note that seven or more frequencies are involved in the third embodiment:

1. The clock frequency of the computer clock 48″.
2. The frequency of the pulse oscillator 13″, which determines the counting rate of the Gray-code counter 20.
3. The up-dating frequency of the duty-cycle register 14″. The period is about 0.13 seconds, that being the greatest rate at which the microcomputer of this particular example can provide new duty-cycle data.
4. Pulse-width-modulated output signal train at terminal 8″ of the microcomputer 4″. Its frequency is, generally speaking, slightly lower than that of the pulse oscillator 13″.
5. Frequency of the pulse-width-modulated Schmitt-trigger oscillator 57, and its output signals at the transistor 21. This frequency is of the order of 10 KHz.
6. AC line signal sensing at terminal 10″ of microcomputer 4″ and at terminal 9 on the contacts 3 of the relay. This is typically 60 Hertz.
7. The on/off period of switching transistor 47. This may be any value within a wide range, typically from ten seconds to ten minutes.

OTHER EMBODIMENTS

Numerous other embodiments are possible within the scope of the invention. The scope is determined by the claims.

What is claimed is:

1. Apparatus for controlling to a predetermined value the pull-in-time delay for pulling in of a relay, which has a coil and contacts and is to be actuated a plurality of times, the pull-in-time delay being defined as the duration of a time interval starting when application of power to the coil of the relay starts and ending when the relay contacts close, comprising:

means for applying a controllable level of average power to said relay coil, said means including an input control signal terminal;

means for storing data specifying a predetermined pull-in-time delay;

means for detecting the start of application of power to said relay coil and providing a start signal thereupon;

means for sensing the closing of said contacts and providing a closure signal thereupon;

means responsive to said start and closure signals to ascertain the actual pull-in-time delay;

means for comparing said actual pull-in-time delay with said predetermined pull-in-time delay and providing an error signal accordingly;

means connecting said error signal with said input control signal terminal with such polarity as to increase said level of average power supplied to said coil when said actual pull-in-time delay is greater than said predetermined pull-in-time delay, and to decrease said level of average power when said actual pull-in-time delay is less than said predetermined pull-in-time delay.

2. Apparatus as in claim 1 and wherein said means for applying a controllable level of average power comprises switching-mode control means.

3. Apparatus as in claim 2 and wherein said means for applying a controllable level of average power comprises electronic switch means having a controllable duty cycle, and said input control signal terminal comprises a terminal for controlling the duty cycle of a train of pulses.

4. Apparatus as in claim 1 and wherein said means for applying a controllable level of average power comprises (a) a power source, (b) a semiconductor switch (47) for applying and stopping power to said coil, and (c) a controllable-duty-cycle switch means (21) in series with said semiconductor switch.

5. Apparatus as in claim 4 and wherein said controllable-duty-cycle switch means includes an oscillator (57) of controllable duty cycle.

6. Apparatus as in claim 4 and wherein said means for applying a controllable level of average power comprises oscillator means for generating a pulse train and computer means for controlling the output pulse width of said oscillator means output pulses.

7. Apparatus as in claim 1 and further comprising circuit means for connecting AC voltage to said relay contacts and further comprising means for sensing the phase angle of said AC voltage and for controlling said time of application of a level of average power to said relay coil so as to precede the phase angle at which said relay contacts close, by said predetermined pull-in-time delay.

8. Apparatus as in claim 1 and further comprising:

computer means for periodically computing and registering data defining a duty cycle for pulse-width-modulated power;

means responsive to said registered data for providing a train of pulses having an average duty cycle as defined by said registered data.

9. Apparatus as in claim 1 and wherein said means for applying a controllable level of average power comprises:

computer means for generating a relatively low-frequency pulse-width-modulated control signal:

means for converting said relatively low-frequency control signal to a DC control signal:

means for generating a relatively higher-frequency oscillation;

means for applying said DC control signal to vary the duty cycle of oscillations of said means for generating said relatively higher-frequency oscillation.

10. Apparatus as in claim 9 and wherein said means for converting to a DC control signal comprises lowpass filter means, and said apparatus further comprises:

a pulse oscillator;

a Gray-code counter connected to count the pulses from said pulse oscillator;

change-detection means for detecting the stage of said Gray-code counter that changed state upon a count;

changeable duty-cycle-register means for storing duty-cycle data;

said means for connecting said error signal with said input control signal terminal comprising means for utilizing said error signal to change the data contents of said changeable duty-cycle-register means at time intervals;

means responsive to said change-detection means for reading out the contents of a predetermined corresponding stage of said duty-cycle-register means, said predetermined corresponding stage depending upon which said stage of said Gray-code counter currently changes state upon a current count, the more-significant-bit stages of said Gray-code counter corresponding to the less-significant-bit stages of said duty-cycle register;

means for, upon said count, utilizing the contents of said stage of said duty-cycle-data-registering means to selectively provide and withhold a data pulse in a pulse train connected to said lowpass filter means.

11. A method for controlling the pull-in-time delay for pulling in of a relay, said relay to be actuated a plurality of times, the pull-in-time delay being defined as the duration of a time interval starting when energization of the coil of the relay starts and ending when the relay contacts close, comprising the steps of:

(a) storing a predetermined reference pull-in-time delay;

(b) applying to the coil of said relay a voltage greater than the rated operating voltage of said coil;

(c) providing a solid-state device in series with said coil and applying a pulsed switching signal thereto to switch said device on and off with the controlled duty cycle to activate said relay;

(d) detecting the closure of the contacts of said relay and providing an indication thereof;

(e) determining the actual pull-in-time delay of said relay by comparing the time of said contact closure indication with the time at which the first pulse of said pulsed switching signal is applied;

(f) automatically comparing said actual pull-in-time delay with said predetermined reference pull-in-time delay;

(g) automatically adjusting said duty cycle of said pulsed switching signal on subsequent activations of said relay until said actual pull-in-time delay equals said predetermined reference pull-in-time delay.

12. Apparatus for energizing a relay having a coil and relay contacts, comprising:

first switching means comprising a pulse-width-modulated switch for pulse-width-modulating of power applied to said coil when said first switching means is conductive;

second switching means comprising means for disconnecting power from said coil irrespective of the state of said pulse-width-modulated first switching means;

a power source connected with said coil and said first and second switching means in series circuit;

oscillator means for switching said pulse-width-modulated switch to conductive and non-conductive conditions in accordance with a controllable duty cycle, the duty cycle of said oscillator means being controllable by a DC signal at a control terminal of said oscillator means;

sensing means for sensing the time of closure of said relay contacts and for providing a closure signal thereupon;

computer means receiving said closure signal and a signal indicating time of connection of power to said coil;

said computer means including means for ascertaining an actual pull-in-time delay, from said time of connection of power to said coil until said closure of said contacts;

storage means in said computer means for storing a reference pull-in-time delay;

said computer means comprising a changeable duty-cycle-register means for storing duty-cycle data;

means for comparing said actual pull-in-time delay and said reference pull-in-time delay and outputting a correction signal to change the data contents of said duty-cycle-register means at time intervals;

a pulse oscillator;

a recycling Gray-code counter that is actuated by cycles from said pulse oscillator, and that counts at least one full cycle of the Gray-code counter during each of said time intervals between changes of data of said duty-cycle-register means;

means for detecting which stage of said Gray-code counter changes state upon each pulse-oscillator cycle;

means for copying the contents of a predetermined corresponding stage of said duty-cycle-register means, said predetermined corresponding stage depending upon which said stage of said Gray-code counter currently changes state upon a current count, the more-significant-bit stages of said Gray-code counter corresponding to the less-significant-bit stages of said duty-cycle register.

* * * * *